United States Patent
Nikitin et al.

(10) Patent No.: US 11,444,435 B2
(45) Date of Patent: Sep. 13, 2022

(54) METHOD AND DEVICE FOR COMBINING LASER BEAMS

(71) Applicant: OBSHCHESTVO S OGRANICHENNOJ OTVETSTVENNOSTYU "FEMTOVIZHN", Skolkovo (RU)

(72) Inventors: Sergej Petrovich Nikitin, Moscow (RU); Matvej Sergeevich Pochechuev, Polevskoj (RU); Aleksej Mihajlovich Zheltikov, Moscow (RU)

(73) Assignee: OBSHCHESTVO S OGRANICHENNOJ OTVETSTVENNOSTYU "FEMTOVIZHN", Skolkovo (RU)

( * ) Notice: Subject to any disclaimer, the term of this patent is extended or adjusted under 35 U.S.C. 154(b) by 841 days.

(21) Appl. No.: 16/321,969

(22) PCT Filed: Oct. 5, 2016

(86) PCT No.: PCT/RU2016/000667
§ 371 (c)(1),
(2) Date: Jan. 30, 2019

(87) PCT Pub. No.: WO2018/026306
PCT Pub. Date: Feb. 8, 2018

(65) Prior Publication Data
US 2019/0181617 A1  Jun. 13, 2019

(30) Foreign Application Priority Data

Aug. 5, 2016 (RU) .......................... RU2016132396

(51) Int. Cl.
G02B 27/14 (2006.01)
H01S 5/40 (2006.01)
(Continued)

(52) U.S. Cl.
CPC ............ H01S 5/4012 (2013.01); G02B 27/14 (2013.01); G02B 27/283 (2013.01); H01S 3/005 (2013.01);
(Continued)

(58) Field of Classification Search
CPC .... H01S 5/4012; H01S 3/005; H01S 5/06236; H01S 5/4087; G02B 27/14; G02B 27/283
(Continued)

(56) References Cited

U.S. PATENT DOCUMENTS

2015/0133751 A1* 5/2015 Stewart .................. A61B 34/30
600/310

FOREIGN PATENT DOCUMENTS

CN   102012567 A    4/2011
SU       141659 A1   12/1966
(Continued)

*Primary Examiner* — William Choi
(74) *Attorney, Agent, or Firm* — Nadya Reingand

(57) ABSTRACT

The invention relates to the field of laser technology and can be used for more efficient optical pumping of laser media in laser generators and amplifiers. The invention can be used for the efficient optical pumping of practically all types of lasers, provided that the absorption profile of the pumped medium is sufficiently broadband. The invention discloses a method and device for combining at least two laser beams of different wavelengths, the polarization states of which are substantially orthogonal, into an exit beam by using a polarizing beamsplitter which spatially combines two beams in mutually orthogonal polarization states, and then changing the polarization state of one of the beams relative to the other using a spectrally selective polarization filter such that the polarization state of the exit beam becomes substantially identical for all of the wavelengths of the exit beam, thus permitting the subsequent combining thereof with another beam.

18 Claims, 5 Drawing Sheets

(51) Int. Cl.
*G02B 27/28* (2006.01)
*H01S 3/00* (2006.01)
*H01S 5/062* (2006.01)

(52) U.S. Cl.
CPC ........ *H01S 5/06236* (2013.01); *H01S 5/4087* (2013.01)

(58) Field of Classification Search
USPC .......................................................... 359/629
See application file for complete search history.

(56) References Cited

FOREIGN PATENT DOCUMENTS

| | | | |
|---|---|---|---|
| SU | 528529 | A1 | 11/1976 |
| SU | 1339469 | A1 | 9/1987 |
| WO | 2019139799 | A1 | 11/2009 |

* cited by examiner

METHOD AND DEVICE FOR COMBINING LASER BEAMS

CROSS-REFERENCE TO RELATED APPLICATIONS

The present patent application is a National stage patent application from PCT application PCT/RU2016/000667 filed Oct. 5, 2016, which claims priority to Russian patent application RU2016132396 filed Aug. 5, 2016, currently issued as a patent RU2649639, all of which incorporated herein in their entirety.

FIELD OF THE INVENTION

The invention relates to the field of laser technology and quantum electronics and can be used for more efficient optical pumping of laser media in laser oscillators and amplifiers. The invention can be used for efficient optical pumping of practically all types of lasers, including solid-state, liquid, fiber and ion lasers, providing that the absorption profile of the pumped medium is sufficiently broadband.

BACKGROUND OF THE INVENTION

Specific examples of lasers, wherein the use of the invention is of particular interest, are lasers and laser amplifiers on Titanium doped sapphire, Chromium doped forsterite, as well as dye lasers and fiber lasers doped with ions of rare-earth metals (Erbium, Thulium, Neodymium or Ytterbium).

The increase in pumping efficiency is achieved as a result of combining of several laser beams into a single high-power beam while preserving its polarization and focusability.

The method is particularly suitable for combining several output beams of high-power (more than 1 \N) low-cost laser diodes into a single beam and allows significant reduction of pump costs and achievement of better energy efficiency of laser optical pump. In particular: lasers based on Titanium doped sapphire are widely used in various scientific fields. Its extremely wide gain spectral bandwidth provides possibility of tuning across near IR-range from 700 to 1000 nm, generation of ultrashort pulses by using Kerr lens passive modelocking and can be utilized for numerous tasks.

The peak of the pump absorption of this medium is located near 500 nm, and its broadness permits to pump it optically using wavelengths ranging widely from 450 to 600 nm. High saturation intensity of Titanium ions in sapphire requires the need of laser to pump this medium. Argon lasers and more recently frequency doubled Neodymium lasers were used for this purpose earlier.

The advent of high-power (more than 1 W) and relatively inexpensive laser diodes, operating in the blue-green spectral range (440-520 nm) with energy efficiency better than 20% now makes possible to pump Titanium doped sapphire by using such laser diodes. The latter approach significantly reduces costs of pumping and improves overall laser energy efficiency, providing that the technical problem of such laser diodes beams combining into a single combined beam, having linear polarization and focusability required for laser pumping is solved.

At present, several methods to combine optical beams have been proposed. Spectral combining is known to be implemented in the work by S. Klingebiel, F. Roser, B. Ortag, J. Limpert, and A. Tunnermann, J. Opt. Soc. Am. B 24, 1716 (2007). The same method is implemented for laser pumping systems in the work by Y. Xiao, F. Brunet, M. Kanskar, M. Faucher, A. Wetter, and N. Holehouse, Opt. Express 20, 3296 (2012), wherein a single high damage threshold grating was used to combine emission of seven 200 W laser diode modules with wavelengths near 970 nm into a single beam to pump a high-power fiber laser. The grating also played the role of an external cavity element and stabilized diodes wavelengths.

These two embodiments are the closest analogues in terms of technical nature, both in terms of the problem being solved and in terms of the converging principle—beams differing in spectrum are used, which are combined into a single beam by spectrally-selective optics. The difference is that in both of these works diffraction gratings were used as spectrally-selective optical components, imposing significant technical requirements on spectral band narrowness of combined optical beams.

Another known method is the geometrical combining of beams. Its embodiment is described in the article by C. G. Durfee, T. Storz, J. Garlick, S. Hill, J. A. Squier, M. Kirchner, G. Taft, K. Shea, H. Kapteyn, M. Murnane, and S. Backus, Opt. Express 20, 13677 (2012). According to this method, a single beam is formed by means of one or more mirrors, oriented so that the combined beams being incident on said mirrors are reflected along the same direction with almost no transverse gaps between them, essentially forming a single beam.

Also, the method of polarization combining of beams is known, which in turn is divided into incoherent polarization combining—T. Y. Fan, IEEE J Sel Top Quantum Ellectron v. 11, 3 p. 567 (2005) and coherent polarization combining—Uberna et al. IEEE J QE v. 46, 8 p. 1191 (2010). Said methods have the following disadvantages, which are essential for laser pumping.

In case of geometrical multiplexing, focusing a set of beams into a common small focal spot significantly reduces the pumping beam quality factor, which makes it difficult to overlap efficiently the cavity mode with the pump intensity distribution over the entire gain medium volume thus reducing pumping efficiency.

Spectral multiplexing by using an angular dispersive element, such as a reflective diffraction grating or a prism also introduces the beam quality factor deterioration due to the diode own spectral bandwidth and imposes significant technical requirements on its spectral width.

In case of incoherent polarization multiplexing, the combined beam is no longer linearly polarized and for some media, particularly for Ti:sapphire, this reduces the pumping efficiency of said beam.

In case of coherent polarization multiplexing, technically complex solutions are required for mutual optical phase synchronization of the laser sources of input (combined) beams, which is not always technically possible, moreover, said solutions are sensitive to external vibrations and require high thermal and mechanical stability of the device.

SUMMARY

Technical Problem and Technical Result

This invention resolves the technical problem of beam combining and discloses an optical capable to combine several laser beams of different wavelengths into a single common beam while maintaining linear polarization and without introducing additional beam divergence of the combined beam (in difference to analogues).

The technical result is the development of both polarization- and spectrally-selective optical system, which resolves said technical problem and is suitable to combine practically unlimited number of individual laser beams into a common beam while preserving their polarization and spatial focusability.

Solution

The following terms are used in this invention.

Orthogonal polarizations are the states of polarizations of light, such that the light beams of these polarizations can be combined or split in a controlled manner by means of polarization optics. Two perpendicular linear polarizations represent a specific case of orthogonal polarizations. Other particular examples of orthogonal states of polarization are right- and left-circular polarizations.

Polarizing beam splitter is an optical element, which combines the light beams of orthogonal polarizations. Polarization cube, polarization-selective prism, in particular Wollaston prism can be used as polarizing beam splitters.

Spectrally-selective polarization filter is an optical element, that changes the light polarization depending on its wavelength, Šolc filter being an example.

To solve the indicated problem, the method is proposed to combine at least two laser beams of different wavelengths and in substantially orthogonal polarization states, into the output beam, wherein said input beams being in mutually orthogonal polarization states are spatially combined by a polarizing beam splitter, followed by a spectrally-selective polarization filter placed to change the polarization state of one of the beams relatively to the other in such a way, that the polarization state of the output beam becomes substantially identical for all of the wavelengths.

The method can be used to combine multiple beams. For this purpose, the sequence of the following actions should be repeated the required number of times:
a) the input laser beam is directed to the polarizing beam splitter,
b) the next beam to be combined, being different in polarization state and wavelength from the previous one, is directed to the polarizing beam splitter, and the output beam from the polarizing beam splitter is directed to a spectrally-selective polarization filter, designed so that the polarization state of the output beam becomes substantially the same for all wavelengths of the output beam,
c) the beam formed according to claim b) is directed to the next polarizing beam splitter to be combined with the next additional laser beam, and then to the next additional spectrally-selective polarization filter.

Mutually orthogonal polarization states could be mutually perpendicular linear polarizations, for which combining is done by a polarizing beam splitter for linear polarizations.

Šolc filter can be used as a spectrally-selective polarization filter. Tuning spectral properties of the combined beams could be done by angular rotation of a spectrally-selective polarization filter.

As an embodiment of the described method, we disclose the device capable to combine at least two laser beams of different wavelengths in substantially orthogonal polarization states into the single output beam with polarization state substantially identical for all of the wavelengths of the output beam, wherein a polarizing beamsplitter is included, which spatially combines two beams of different wavelengths with substantially orthogonal polarization states and also a spectrally-selective polarization filter, which provides the polarization rotation for one of the beams relatively to the other beam in such a way, that the polarization state becomes substantially identical for all of the wavelengths in the output beam.

In the device the polarization cube or polarization prism can be used as a polarizing beam splitter, and Šolc filter can be used as a spectrally-selective polarization filter, which consists of a stack of plates appropriately mutually oriented by angle and made of birefringent material. Plates can have different thicknesses and be made of different materials.

The embodiment of the device may contain a spectrally-selective polarization filter where spectral and polarization tuning is done by applying an external control voltage.

As an embodiment of the method, we also disclose the system for spatial combining of k laser beams of different wavelengths and in substantially orthogonal polarization states into a single output beam, wherein the devices described above are subsequently arranged so that the preceding K−1 beams are subsequently combined to the output beam, while the design of a spectrally-selective polarization filter is such that the polarization state of the output beam becomes substantially the same for all wavelengths of the output beam.

The final combining stage of the system can be comprised of a polarizing beamsplitter without spectrally-selective polarization filter for beam combining, so that the output optical emission contains both orthogonal polarizations.

DETAILED DESCRIPTION OF THE PREFERRED EMBODIMENT

Use of polarization Šolc filters (I. Šolc, J. Opt. Soc. Am. 55, 621 (1965)), previously proposed as narrowband spectral filters is suggested to solve the problem of combining of several laser beams of different wavelengths into a single one without changing the state of linear polarization and without usage of spectrally-selective devices introducing spatial angular dispersion, which is undesirable due to additional divergence.

A single birefringent plate of thickness d, placed between two crossed polarizers, with the optical axis at an angle of 45° with respect to the polarizers axes, can be considered as a simplest Šolc filter. Such a system can serve as a multiplexer for 2 beams of different wavelengths. If the plate birefringence such that $n_o$, $n_e$ are refractive indices for ordinary and extraordinary waves, the phase delay difference equals to $\Delta\Phi=2\pi d/\lambda$, thus, at some wavelengths the plate is a "half-wave" ($\Delta\Phi=2\pi(k+\frac{1}{2})$) and rotates the polarization, and for some it is a "full-wave" ($\Delta\Phi=2\pi k$) and polarization remains unchanged.

To combine a larger number of beams, a stack of N plates with optical axes forming set of angles $\rho=+\pm\pi/(4N)$ can be used instead of a single plate. Compared to a single plate, this filter has higher spectral selectivity defined as the ratio of transmission bandwidth $\delta\lambda$ to the separation of adjacent transmission peaks $\Delta\lambda$, wherein this ratio is approximately equal to the number of plates used, while the separation between the adjacent transmission peaks is determined by the thickness of the individual plates in the stack. Basic properties of that filter can be described analytically (see the book by A. Yariv and P. Yeh, *Optical Waves in Crystals: Propagation and Control of Laser Radiation* (Wiley-Interscience, Hoboken, N.J., 2002), the distance between the peaks, i.e. the free spectral range for the case of thick plates is given by the formula:

$$\Delta\lambda \approx \frac{\lambda^2}{d(n_0-n_e)}$$

while the width of the transmission peak (at FWHM)

$$\delta\lambda \approx 0.8\frac{\lambda^2}{d(n_0-n_e)N}$$

Figure 1:
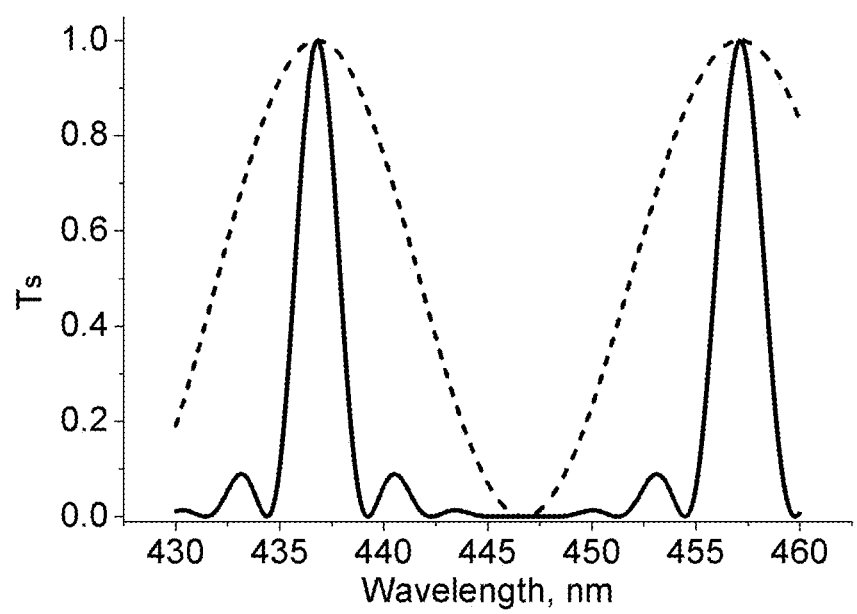
FIG. 1 shows transmission of Šolc filters, consisting of 7 plates (narrow peak) and of a single plate (wide peak).

Such filters can be used to combine any number of laser beams whose spectra are non-overlapping. As an example, FIG. 1 presents spectral transmission for the Šolc filter, made of 7 quartz plates of 1.1 mm thickness in comparison to the transmission for the filter, made of a single plate.

Figure 2:
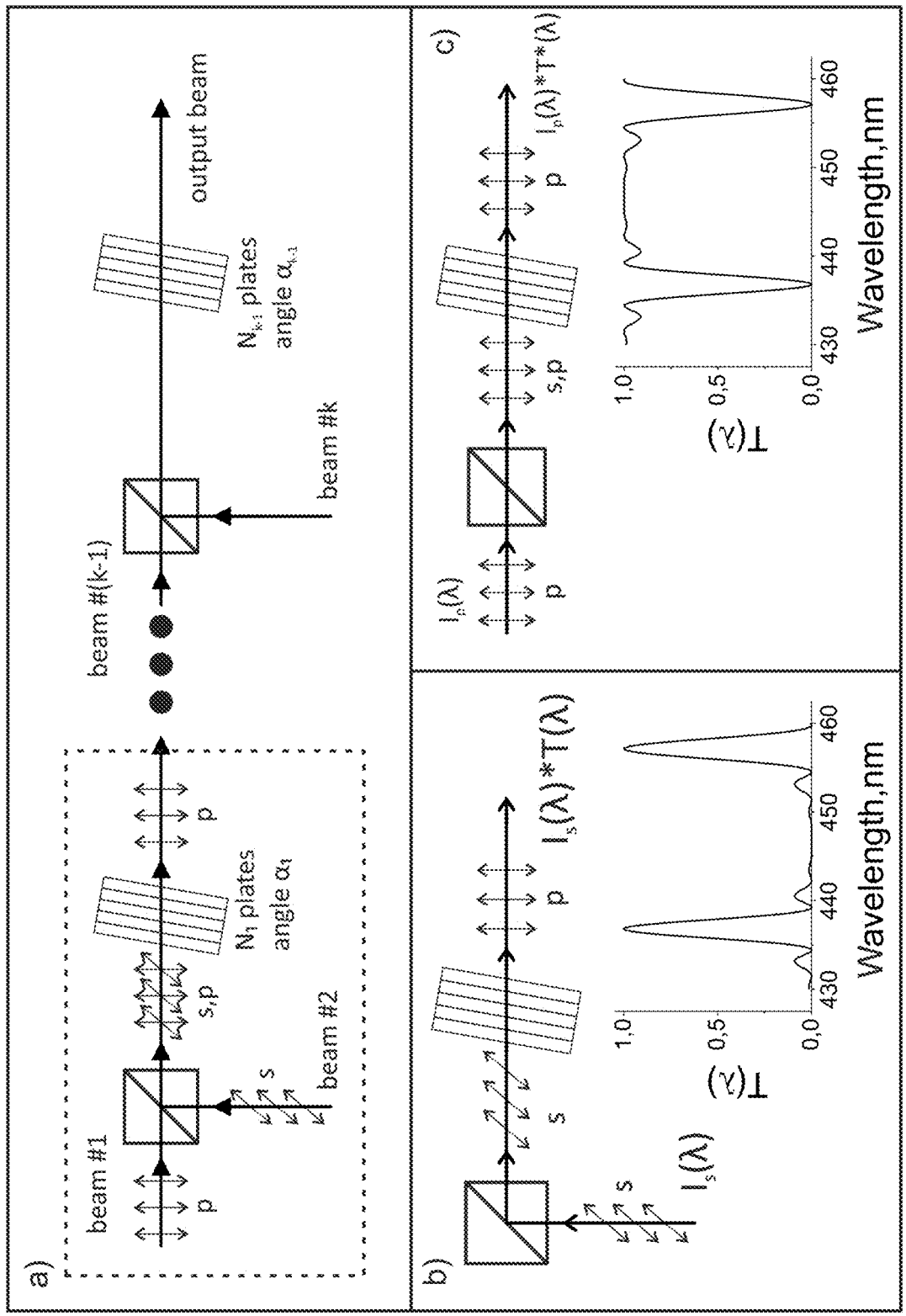
FIG. 2 a) shows a general schematic to combine k beams using birefringent plates. The rectangle denotes the elementary stage of the combining schematic. 2 beams of different polarizations are being combined by means of a polarization cube and propagation through a specially designed stack of $N_{k-1}$ plates. The rotation angle $\alpha_{k-1}$ is used for spectral adjustments. The process is repeated k−1 times. b) and c)—propagation of s and p polarizations through the denoted stage. Proper selection of wavelengths and birefringent plates thicknesses allows highly efficient combining of 2 beams at initially different polarizations.

FIG. 2 presents a principal schematic of polarization-spectral combining of k beams by means of Šolc filters. In each of the combining stages, the spectral transmission of the filter is adjusted by small rotation of the plates stack by an angle $\alpha_t$ around the axis perpendicular to the plane of the figure in order to maximize power transmitted to the next combining stage.

It is also possible to solve this technical problem, by using the method, different from the specified one in that at one or more stages of the beams combining, an interference spectral filter is used instead of a polarization spectral filter. The latter embodiment may be preferable when the number of combined beams is small or if the spectra of combined beams are sufficiently wide.

There are possible embodiments of the beams combining schematic shown in FIG. 2, wherein the polarization filters are utilizing plates of different thicknesses.

There are possible embodiments of the beams combining schematic shown in FIG. 2, wherein the polarization filters are utilizing plates made of different birefringent materials.

There are possible embodiments of the beams combining schematic shown in FIG. 2, wherein the polarization filters are utilizing plates, composed of different materials. Such embodiments allow reduced requirements to the divergence of the combining beams.

There are possible embodiments of the beams combining schematic shown in FIG. 2, wherein the filters designed for polarization states of light at the input and output, different from the ones, shown in FIG. 2. For this purpose, additional birefringent plates or light polarizers can be used.

There are possible embodiments of the beams combining schematic shown in FIG. 2, wherein the filters design, in addition to the combining stages, based on the Šolc filters, additionally provides a stage for incoherent polarization combining.

There are possible embodiments of the beams combining schematic shown in FIG. 2, wherein the filters design allows their rotation for dynamic adjustment to one or more wavelengths of combined beams.

To test the feasibility and study the achievable technical result, an experimental research of spatial, spectral and polarization characteristics of two types of laser diodes with wavelengths, suitable for pumping Titanium doped sapphire have been performed and the method of polarization-spectral multiplexing have been proposed.

Two different types of diodes from different manufacturers were chosen as sources of laser pumping for gain medium based on Titanium in sapphire: Nichia NDG7K75T with nominal wavelength of 520 nm and power of 1 W and Osram PL TB450B with nominal wavelength of 450 nm and power of 1.6 W. Both wavelengths are within the absorption spectrum of the gain medium, wherein the wavelength of the Nichia NDG7K75T laser diode is closer to the peak of the absorption spectrum. The following characteristics of laser diodes have been experimentally measured:

The light power versus the pump current (UI characteristic),

Spectral linewidth, central wavelength and their dependencies on temperature and pump current for several randomly selected diodes, The beam quality parameter $M^2$, measured independently for two coordinates The degree of linear polarization for the beam.

Figure 3:
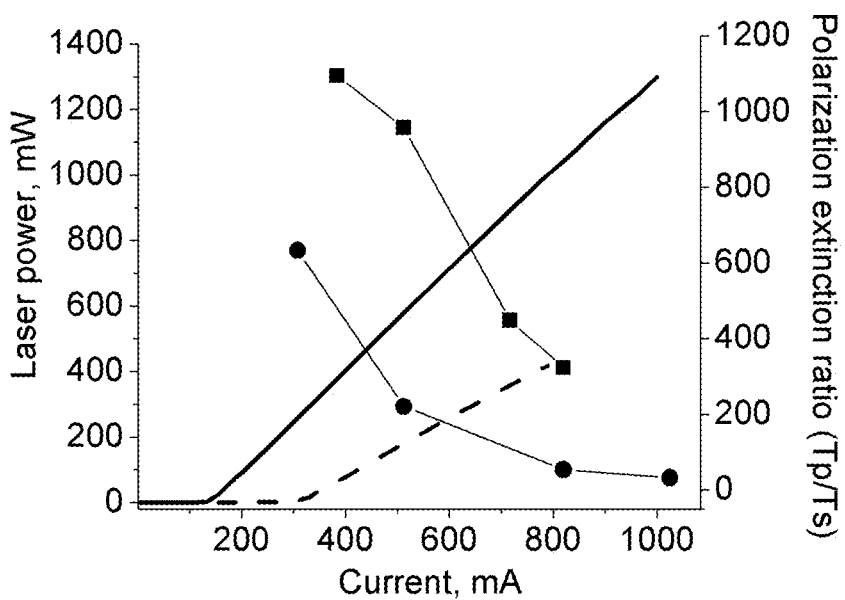
FIG. 3 shows the light power versus current characteristic (dotted line) and polarization characteristic (solid line) of Osram PL TV450V (450 nm) laser diodes and Nichia NDG7K75T (520 nm) laser diodes. For Osram PL TB450B diode with 450 nm nominal wavelength at 1 A current, the ratio of linear polarizations Tp/Ts exceeds 40.

FIG. 3 shows UI characteristics for both diode types. One can see that Nichia NDG7K75T diodes are characterized by higher threshold current and lower differential energy efficiency. For example, at a current value of 1 A both "green" Nichia NDG7K75T and "blue" Osram PL TB450B diodes consume about 4.8 W of electrical power. However, the "blue" laser diode Osram PL TB450B emits 2 times more optical power (1.4 W vs 0.6 W), and this should be taken into account when evaluating an overall energy efficiency of the device. It can be expected that further technological progress in the field of laser diodes will improve their efficiency.

Using the Ocean Optics spectrometer, HR4000CG-UV-NIR, the central wavelengths of 12 "blue" Osram PL TB450B diodes and of 2 "green" Nichia NDG7K75T diodes were determined. Measurements at different temperatures determined that the central wavelength temperature coefficient was equal to 0.07 nm/K for "blue" and 0.06 nm/K for "green" diodes. Measurements of 12 diode spectra from two different production batches gave the estimate for the wavelength variability, which in our case was 12 nm (from 441.3 nm to 453.3 nm) for "blue" diodes. In order to measure spectral full widths at half-maximum (FWHM) additional measurements with the resolution of 0.05 nm were carried out using "LOMO" MDR-23 monochromator. The linewidths for "blue" and "green" diodes were found to be 1.1 nm and 2.1 nm respectively.

The high-resolution (≤0.05 nm) emission spectra at different currents were measured for "blue" and "green" diodes by using the monochromator (1200 grooves/mm, f=550 mm) with a CCD-camera. As the current increases, the average wavelength of the output spectrum shifts to longer wavelengths, but the more detailed (fine) structure of the spectrum is changing in a more complex way. At low currents nearly above the lasing threshold mode jumps on the scale of a few seconds were observed. At higher currents, the spectrum is a function of current and temperature and remains stable for longer times (minutes).

The degree of linear polarization of the output emission was measured by using polarizer Thorlabs PBS102 with the extinction ratio better than 1000:1. Output polarization for all diodes was close to linear. More than 97% of power is in the polarization with the E-field vector along the "slow axis"—the axis of lower beam divergence.

Figure 4:
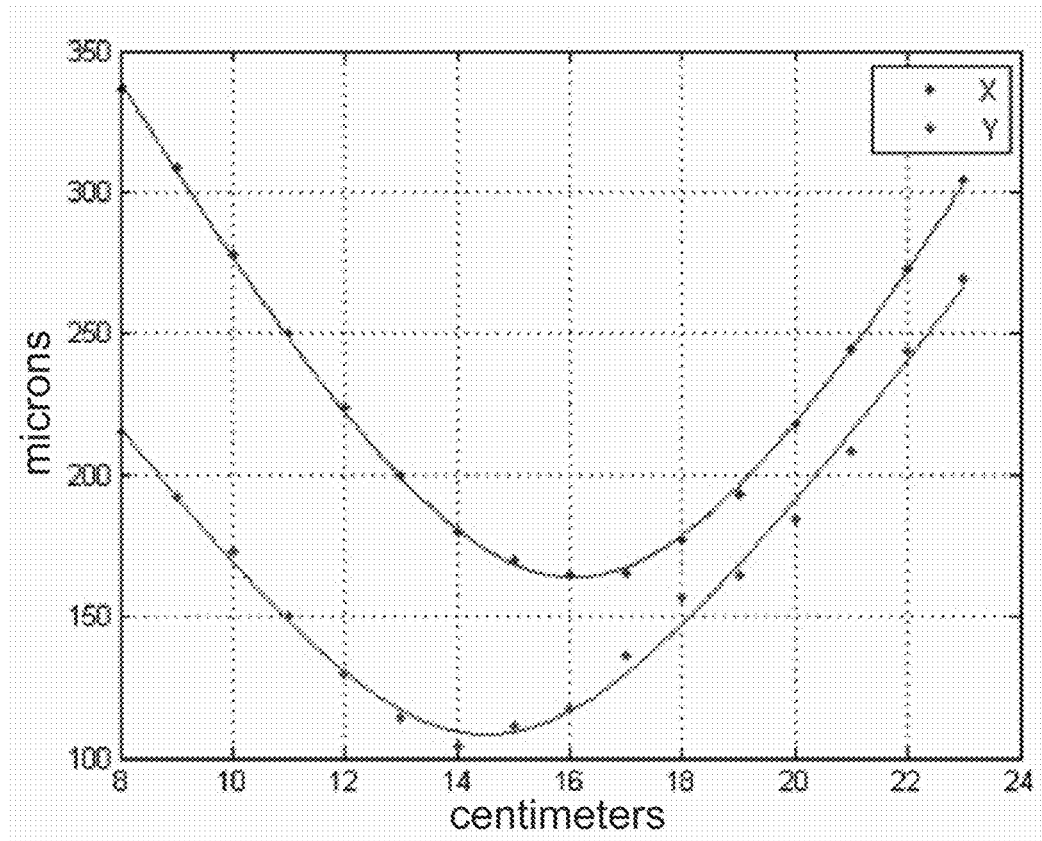
FIG. 4 presents experimentally measured beam size plotted versus longitudinal position along the optical axis obtained for Osram PL TV450V diode with nominal wavelength of 450 nm at 1 A current and at +15° C. temperature.
Figure 6A:
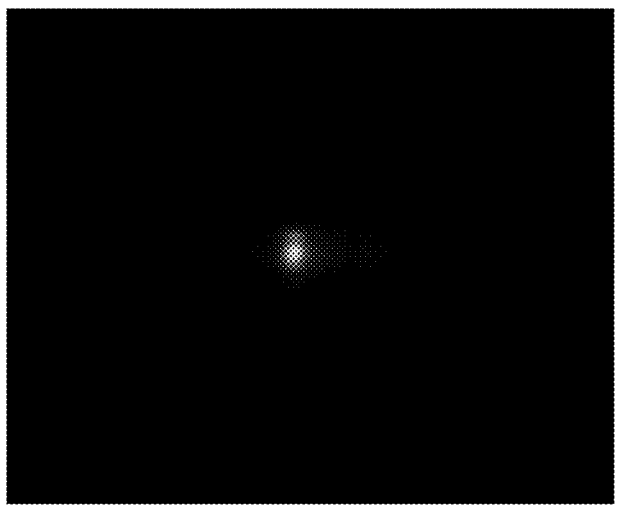
FIGS. 6A and 6B present experimentally obtained beam intensity distributions at distances of 14 cm (on the left) and of 20 cm (on the right) respectively.
Figure 6B:
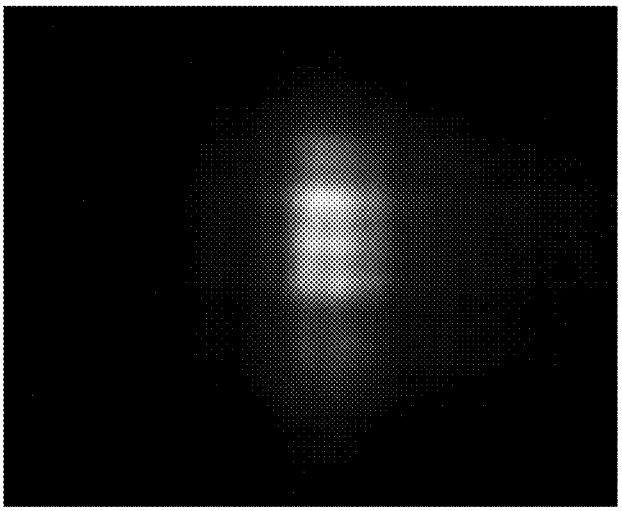

Since the Kerr lens modelocking mechanism imposes very strict requirements on the beam focusability into the gain medium, one of the most important properties of the radiation source for pumping such lasers is its spatial quality, which is usually described by using $M^2$ parameter. For a real beam $M^2$ is always larger than 1. This parameter was measured in accordance with the standard procedure (ISO 11146-2:2005 - Lasers and laser-related equipment) for both types of laser diodes independently in two perpendicular planes - containing the "fast" (Y) and the "slow" (X) axes of the laser diode (Y). For that purpose, the beam was collimated by the aspherical lens Thorlabs C230TMD-A, expanded along the slow axis by 4.75 times by using a cylindrical telescope and focused by the lens with a long focal length of 400 mm. The beam profiles were measured with a CCD-camera for different distances from the waist position, so that at least 5 measurement locations are within the range of Rayleigh and the same number of measurements are outside. The measurement results are shown in FIG. 4, and the corresponding beam intensities are in FIGS. 6A and 6B. Basing on the obtained measurements, the second moments of intensity distributions were determined and from their dependencies on the longitudinal distance the beam quality parameters for two axes were calculated in accordance with the procedure, described in ISO 1 1146-2: 2005 - Lasers and laser-related equipment. Measured values of $M^2_x$ and $M^2_y$ equal to (5.7; 2) and (4.5; 2.2) for "blue" and "green" diodes respectively.

The obtained data on beams quality, their spectral and polarization properties allow to conclude that these laser diodes are suitable for use as pump lasers for Titanium doped sapphire oscillators, including passively modelocked due to Kerr lens mechanism. This is practically significant for using such lasers as the sources of ultrashort optical pulses. On the basis of the given measurements results, it is possible to specify necessary requirements for the beams combining method—

The spectral range: about 12 nm,
Resolution: 2 nm,
Input spectral width: 1-1.2 nm,
Output power 3 W (6W for double-side pump).

To estimate possible limitations of the said method its energy efficiency was calculated using Jones matrices formalism, outlined in A. Yariv and P. Yeh, Optical Waves in Crystals: Propagation and Control of Laser Radiation (Wiley-lnterscience, Hoboken, N.J., 2002), for the case of combining beams from seven laser diodes having spectra separated by 2 nm and uniformly filling a spectral range of 12 nm. Gaussian functions of 1.1 nm widths (FWHM) have been used to approximate the actual spectra. The specified spectral characteristics can be obtained by using stacks made of 7 quartz plates each of d=1.1 mm thickness. Quartz indices of refraction can be found in "HANDBOOK OF OPTICS Volume II. Devices, Measurements, and Properties".

At each beam combining stage, the optimized rotation angle for the stack of plates is calculated to maximize the combined power. At all optimized positions the stacks are tilted by smaller than 30° angles. To account for the losses, s-polarization reflection coefficient has been set to 0.985 and p-polarization transmission coefficient has been set to 0.94, these values are typical for inexpensive polarization cubes. The reflection loss at each coated surface of the quartz plate have been set equal to 0.2%. Due to lower loss for the reflection, each subsequent combining stage is geometrically rotated by 90° with respect to the preceding one. To account for assembly errors, the angles of the optical axes in the calculation are randomly offset within ±2° range while the plates thickness are randomly offset within ±5 microns range.

Figure 5:
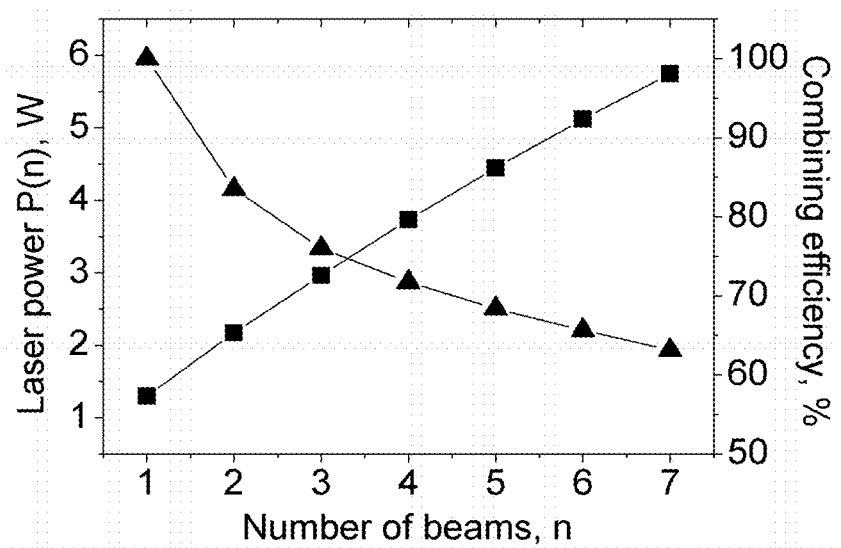
FIG. 5 shows achievable in practice power of the combined beam (on the left) and energetic combining efficiency (on the right), depending on the number of combined beams from Osram PL TV450V diodes.

The results of the calculations are presented in FIG. 5. As can be seen from the graph, in case of 7 input beams and 6 combining stages, the energy efficiency of the beam combiner is about 63%, thus permitting to achieve the level of 5.7 W if the output power from each diode is 1.3 W. Since there is no polarizer at the output, some additional power is also contained in the orthogonal polarization. As follows from the calculation above, the total pump power in excess of 11 W is achievable if "blue" diodes and double-side pump geometry are used, while the beam quality parameter remains close to the original value and its polarization is almost linear.

Figure 7:
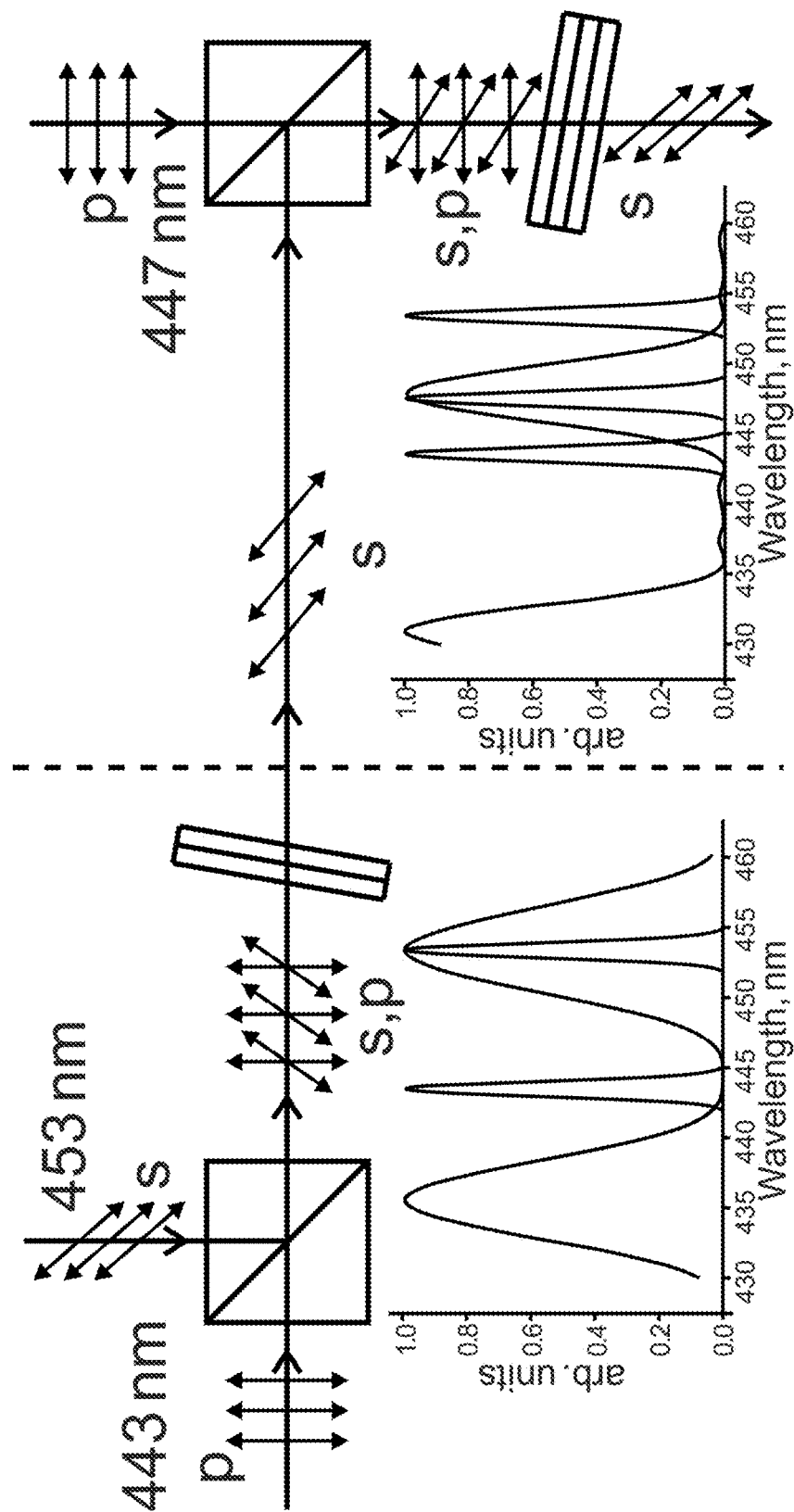
FIG. 7 presents a schematic of practical embodiment to combine 3 beams. The multiplexer consists of 2 stages, marked by dotted rectangles. The graphs show the transmission spectra for the corresponding Šolc filters and the spectra of the beams at each combining stage. The energy efficiency of the embodiment is about 90%.

FIG. 7 shows a schematic of practical embodiment to solve the technical problem of achieving the level of 6-7 W with double-side pump. Compared to the general schematic shown in FIG. 2, the practical embodiment is greatly simplified and limited to the pair of beam combiners, each designed to combine 3 beams. Due to the fact that the diodes are spectrally separated at a much greater distance (4 nm instead of 2 nm), the requirements to the filters design are relaxed, which makes it possible to use only 5 phase plates. The latter fact reduces the cost of the multiplexer and increases its energy efficiency, which is close to 90% in this case.

The described embodiments demonstrate that the technical result achievable by using this invention is adequate to the level necessary to solve said technical problem.

What is claimed is:

1. A method of combining at least a first input laser beam and a second input laser beam, of different wavelengths, polarization states of which are predominantly orthogonal to an output beam, comprising:

using a polarization beam splitter for spatially combining the at least first and second input laser beams in mutually orthogonal polarization states, directing the spatially combined at least first and second input laser beams to a set of birefringent plates, and changing a state of polarization of the first input laser beam relative to the second input laser beam by tilting the set of birefringent plates in such a way that a state of polarization of the output beam becomes predominantly the same for all wavelengths of the output beam, wherein the set of birefringent plates maintains a beam quality parameter M2.

2. The method according to claim 1, wherein the mutually orthogonal polarization states are mutually perpendicular linear polarizations, which are combined by a polarization beam splitter for linear polarizations.

3. The method according to claim 2, wherein a Šolc filter comprises the set of birefringent plates.

4. A method of combining a plurality of input laser beams, of different wavelengths, polarization states of which are predominantly orthogonal to an output beam, comprising:

using a polarization beam splitter for spatially combining at least two input laser beams of the plurality of input laser beams in mutually orthogonal polarization states, and directing the spatially combined at least two input laser beams to a set of birefringent plates, and changing a state of polarization of one of the at least two input laser beams relative to the other input laser beam by tilting the set of birefringent plates in such a way that a state of polarization of the output beam becomes predominantly the same for all wavelengths of the output beam, wherein the set of birefringent plates maintains a beam quality parameter M2, directing the output beam to a next polarization beam splitter to combine the output beam with a third input laser beam, directing the combined output beam with the third input laser beam to a next set of birefringent plates to perform a spectrally-selective change of light polarization of the third input laser beam relative to the output beam, and repeating for any additional input laser beams.

5. The method according to claim 4, wherein the mutually orthogonal polarization states are mutually perpendicular linear polarizations, which are combined by a polarization beam splitter for linear polarizations.

6. The method according to claim 4, wherein the mutually orthogonal polarization states are mutually perpendicular linear polarizations, which are combined by a polarization beam splitter for linear polarizations.

7. A device for combining at least a first input laser beam and a second input laser beam with different wavelengths, polarization states of which are predominantly orthogonal, into one output beam, a polarization state of which is predominantly the same for all wavelengths of the output beam, comprising at least one combination of:

a polarization beam splitter that spatially combines the two input laser beams with different wavelengths whose polarization states are predominantly orthogonal, and a successively placed set of birefringent plates mutually oriented at an angle, wherein a thickness, a mutual orientation, and a material of the set of birefringent plates provides a change of the polarization of the first input laser beam relative to the second input laser beam in such a way that a state of polarization becomes predominantly the same for all wavelengths of the output beam, wherein the set of birefringent plates preserves a beam quality parameter M2.

8. The device according to claim 7, wherein a polarization cube or a polarization prism is used as the polarization beam splitter.

9. The device according to claim 8, wherein a Šolc filter comprises the set of birefringent plates.

10. The device according to claim 9, wherein the set of birefringent plates are equipped with a spectral polarization adjustment using an applied external control voltage.

11. The device according to claim 8, wherein the birefringent plates have different thicknesses.

12. The device according to claim 11, wherein the set of birefringent plates are equipped with a spectral polarization adjustment using an applied external control voltage.

13. The device according to claim 8, wherein the birefringent plates are made of different materials.

14. The device according to claim 13, wherein the set of birefringent plates are equipped with a spectral polarization adjustment using an applied external control voltage.

15. The device according to claim 8, wherein the set of birefringent plates are equipped with a spectral polarization adjustment using an applied external control voltage.

16. The device according to claim 7, wherein the set of birefringent plates are equipped with a spectral polarization adjustment using an applied external control voltage.

17. A system for spatial combining of K laser beams with different wavelengths, polarization states of which are predominantly orthogonal, into at least one output beam, comprising: two or more devices according to claim 7 being sequentially arranged; and on each output beam of those two or more devices the rest of K-1 beams are combined; wherein a design of the set of birefringent plates is such that the state of polarization of the output beam becomes predominantly the same for all wavelengths of the output beam.

18. The system of claim 17, wherein the beam splitter is used as a final stage which provides simplification of the optical system for spatial combining of laser beams when the state of polarization of the output beam is not important.

* * * * *